(12) United States Patent
Kroon et al.

(10) Patent No.: US 6,747,282 B2
(45) Date of Patent: Jun. 8, 2004

(54) LITHOGRAPHIC APPARATUS, DEVICE MANUFACTURING METHOD, AND DEVICE MANUFACTURED THEREBY

(75) Inventors: Mark Kroon, Utrecht (NL); Jan Evert Van Der Werf, Waalre (NL); Haico Victor Kok, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/164,706

(22) Filed: Jun. 10, 2002

(65) Prior Publication Data

US 2003/0001107 A1 Jan. 2, 2003

(30) Foreign Application Priority Data

Jun. 13, 2001 (EP) .............................................. 01202274

(51) Int. Cl.$^7$ .............................................. G03B 27/52
(52) U.S. Cl. ........................ 250/492.2; 355/72; 355/75; 355/53; 355/30
(58) Field of Search ........................ 250/492.2; 355/66, 355/67, 315, 53, 72, 75, 30; 438/16, 30

(56) References Cited

U.S. PATENT DOCUMENTS

| 4,585,342 A | 4/1986 | Lin et al. |
| 5,153,916 A | 10/1992 | Inagaki et al. |
| 5,265,143 A | 11/1993 | Early et al. |
| 5,767,523 A | 6/1998 | McCullough |

FOREIGN PATENT DOCUMENTS

EP          1 063 570 A2     12/2000

*Primary Examiner*—John R. Lee
*Assistant Examiner*—Zia R. Hashmi
(74) *Attorney, Agent, or Firm*—Pillsbury Winthrop LLP

(57) ABSTRACT

One example of a lithographic projection apparatus includes an image sensing device configured and arranged to measure a pattern in a patterned projection beam. The image sensing device includes a slab and a radiation-sensitive sensor that is sensitive to the radiation of the projection beam. The image sensing device also includes a film of a material that is non-transparent to the radiation of the projection beam. This film is provided over the sensor and includes one or more patterned segments to selectively pass radiation of the projection beam to the sensor. The apparatus also includes an intermediate plate made from a material having a thermal expansion coefficient below approximately $12 \times 10^{-6} K^{-1}$ and having a slab-bearing surface.

24 Claims, 5 Drawing Sheets

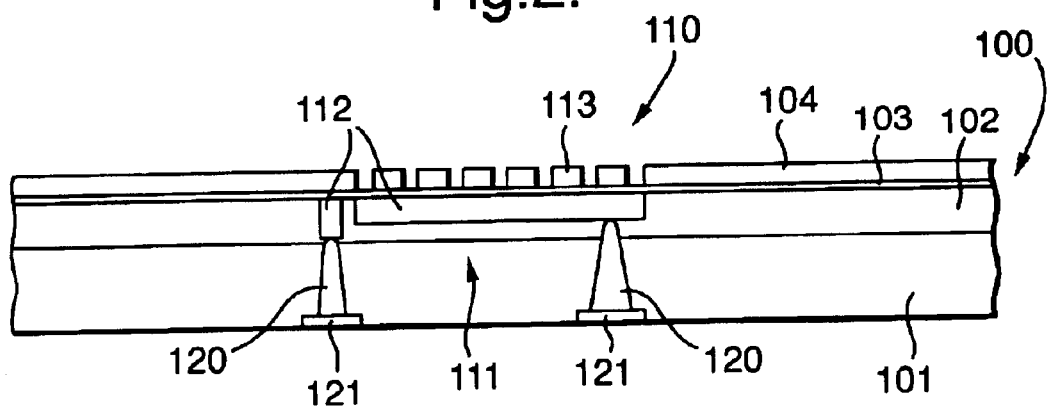
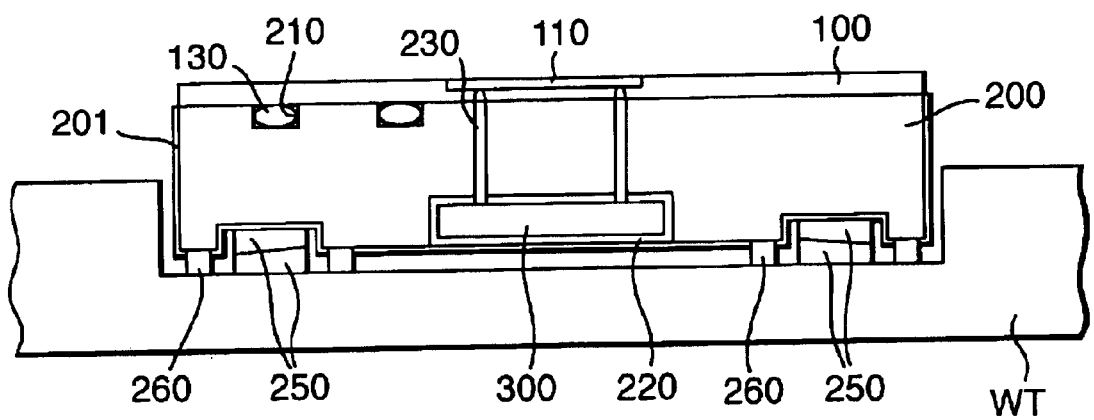
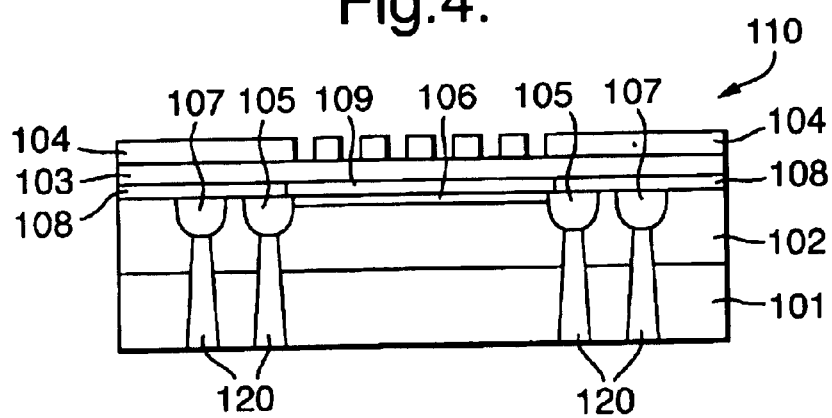

Fig.6.
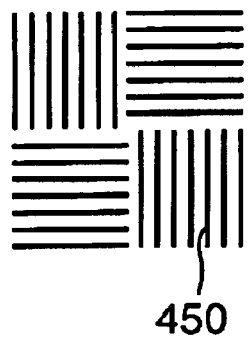
450
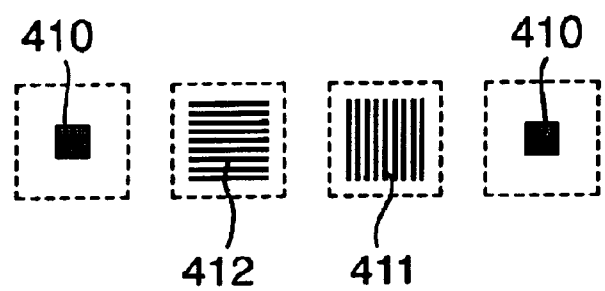
412  411
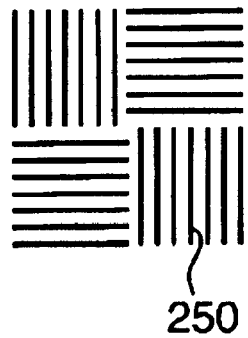
250
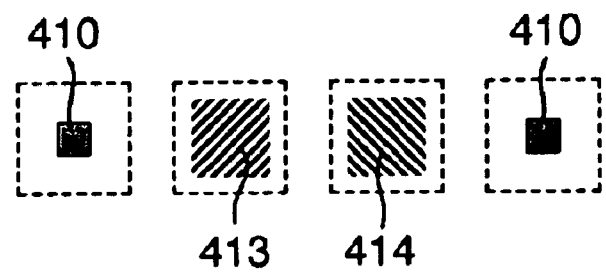
413  414

LITHOGRAPHIC APPARATUS, DEVICE MANUFACTURING METHOD, AND DEVICE MANUFACTURED THEREBY

This application claims priority to EP 01202274.5 filed Jun. 13, 2001.

FIELD OF THE INVENTION

The present invention relates to lithographic projection methods, systems, and apparatus and to products of such methods, systems, and apparatus.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096. In the case of a programmable mirror array, the said support structure may be embodied as a frame or table, for example, which may be fixed or movable as required.

A programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791.

An image sensing device, which may be mounted on the substrate table, is used to measure a mark pattern present in the patterning structure so as to determine a plane of best focus of the lens, to determine lens aberrations, and to align the substrate table with respect to the patterning structure. Presently, an image sensor comprises several separate sensors located behind detection structures that may take the form of gratings. Generally, one type of detection structure is present above a single sensor, and several detection structures and respective sensors are required to determine the pattern characteristics as described. The detection structures may generally be processed in a single plate behind which the separate sensors are located.

The use of separate sensors requires a rather large distance between neighboring sensors. This requirement makes an imaging device that includes several complementary sensors and detection structures rather large, which may cause a problem when a narrow illumination field is being used and which may also limit measurements at the edge of the image field. Further, the present structured plate above the sensors may be somewhat unflat due to a mechanical treatment to make the detection structures and to mount it above the separate sensors. This shortcoming may cause capturing problems, since not all detection structures may be in best focus simultaneously.

Especially when short-wavelength radiation (such as extreme ultraviolet (EUV) radiation in the range of 10 to 15 nm) is used, the illumination field will become narrower and the requirements for the flatness of the plane in which the detection structures are present will become more stringent. Shorter wavelength radiation also requires the plate in which the detection structures are present to be thinner and the line widths of the detection structures to be smaller. A very flat image sensing plate is also required for a level sensor that may be used to determine height and tilt of the substrate table.

SUMMARY

As described herein, embodiments of the present invention may include an image-sensing device of which separate sensors and respective detection structures are located very close so as to present limited dimensions.

Embodiments of the present invention may also include an image-sensing device of which a front surface is very flat such that the various detection structures are arranged in one well-defined plane.

Embodiments of the present invention may further include an image-sensing device of which dimensions are very insensitive to temperature variations.

One embodiment of the invention is a lithographic projection apparatus that is configured and arranged to image a pattern onto a substrate that is at least partially covered by a layer of radiation-sensitive material. This apparatus includes a radiation system configured and arranged to provide a projection beam of radiation, a support structure configured and arranged to support a patterning structure that serves to produce a desired pattern in the projection beam, a substrate table configured and arranged to hold the substrate, and a projection system configured and arranged to project the patterned projection beam onto a target portion of the substrate.

The apparatus also includes an image sensing device configured and arranged to measure a pattern in the patterned projection beam. The image sensing device includes a slab and a radiation-sensitive sensor arranged on a first side of the slab. The sensor is an integral part of said slab and is sensitive to the radiation of the projection beam.

The image sensing device also includes a film of a material that is non-transparent to the radiation of the projection beam. This film is provided on the first side of the slab over the sensor and includes one or more patterned segments above the sensor to selectively pass radiation of the projection beam to the sensor.

The apparatus also includes an intermediate plate made from a material having a thermal expansion coefficient below approximately $12 \times 10^{-6} K^{-1}$. The slab is mounted such that a surface opposite to its first side faces a slab-bearing surface of the intermediate plate.

For at least some applications of such an apparatus, one or more sensors may be made accurately in a slab of material, preferably a wafer of semiconductor material, such as a silicon wafer, using semiconductor manufacturing techniques, and the slab preferably being polished to have very flat surfaces. Mechanical stability and a very good overall flatness is then achieved by mounting the slab onto the intermediate plate, which is also preferably polished to have a very flat slab-bearing surface. Direct bonding of slab to an intermediate proves to be a very strong and efficient means of attachment. Electrical connections to the sensors may now advantageously be provided through slab and intermediate plate to further electronics.

Another embodiment of the invention is a lithographic projection apparatus that is configured and arranged to image a pattern onto a substrate that is at least partially covered by a layer of radiation-sensitive material. This apparatus includes a radiation system configured and arranged to provide a projection beam of radiation, a support structure configured and arranged to support a patterning structure that serves to produce a desired pattern in the projection beam, a substrate table configured and arranged to hold the substrate, and a projection system configured and arranged to project the patterned projection beam onto a target portion of the substrate.

The apparatus also includes an image sensing device configured and arranged to measure a pattern in the patterned projection beam. The image sensing device includes a slab and at least two radiation-sensitive sensors arranged on a first side of the slab. The sensors are an integral part of said slab and are sensitive to the radiation of the projection beam.

The image sensing device also includes a film of a material that is non-transparent to the radiation of the projection beam. This film is provided on the first side of the slab over the sensors and includes one or more patterned segments above the sensors to selectively pass radiation of the projection beam to the sensors.

In this apparatus, at least one of the sensors is configured and arranged to measure an intensity of an unpatterned area in a cross-section of the patterned projection beam, and at least another one of said sensors is configured and arranged to measure an intensity of a patterned area neighboring the unpatterned area in the cross-section of the patterned projection beam. Each of the patterned segments above the sensors comprises a plurality of transmissive structures, a width of the transmissive structures within each patterned segment being at least substantially equal.

Another embodiment of the invention is a device manufacturing method that includes using a radiation system to provide a projection beam of radiation; using patterning structure to endow the projection beam with a pattern in its cross-section; and projecting the patterned beam of radiation onto a target portion of a layer of radiation-sensitive material that at least partially covers a substrate. This method also includes measuring a pattern in the patterned projection beam using an image sensing device that includes a slab; a radiation-sensitive sensor arranged on a first side of the slab, the sensor being an integral part of said slab and being sensitive to the radiation of the projection beam; and a film of a material that is non-transparent to the radiation of the projection beam. The film is provided on the first side of the slab over the sensor and has a patterned segment above the sensor configured and arranged to selectively pass radiation of the projection beam to the sensor. The slab is mounted with a surface opposite to the first side facing a slab-bearing surface of an intermediate plate made from a material having a thermal expansion coefficient below approximately $12 \times 10^{-6} K^{-1}$.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 schematically depicts a cross-section of an image sensing device being part of the apparatus of FIG. 1;

FIG. 3 schematically depicts the image sensing device of FIG. 2 mounted on the substrate table shown in FIG. 1;

FIG. 4 shows further details of a sensor being part of the image sensing device;

FIG. 6 depicts two further sets of image sensor marks and neighboring alignment marks;

DETAILED DESCRIPTION

Figure 1:
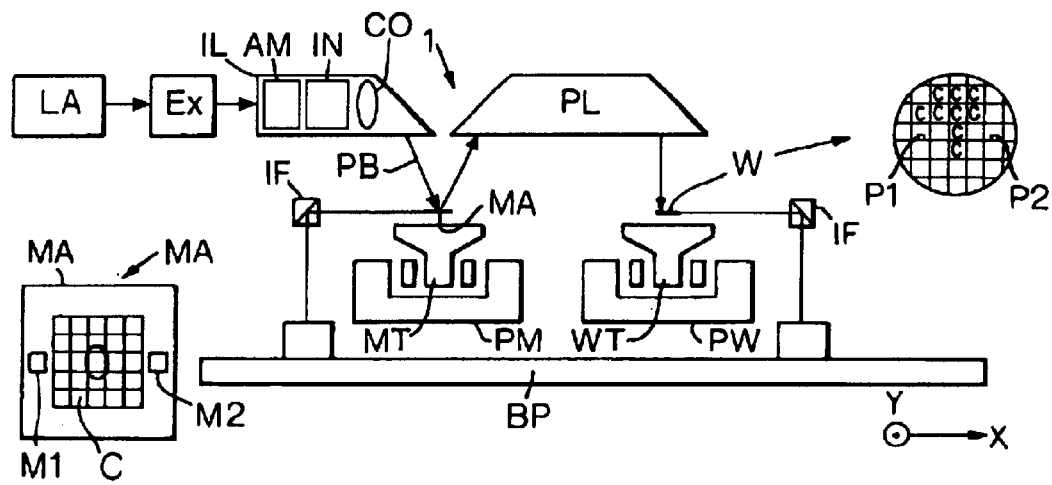
FIG. 1 schematically depicts a lithographic projection apparatus according to an embodiment of the invention.

FIG. 1 schematically depicts a lithographic projection apparatus according to a particular embodiment of the invention. The apparatus comprises:

A radiation system Ex, IL, for supplying a projection beam PB of radiation (e.g. UV or EUV radiation). In this particular example, the radiation system also comprises a radiation source LA;

A first object table (mask table) MT provided with a mask holder for holding a mask MA (e.g. a reticle), and connected to a first positioning structure for accurately positioning the mask with respect to item PL;

A second object table (substrate table) WT provided with a substrate holder for holding a substrate W (e.g. a resist-coated silicon wafer), and connected to a second positioning structure for accurately positioning the substrate with respect to item PL; and A projection system ("lens") PL (e.g. reflective, a refractive or a catadioptric lens design) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a mercury lamp, an excimer laser, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g.

with the aid of suitable direction mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

A sensor plate 100 comprising an image sensing device (image sensor) 110 is mounted on substrate table WT, the image sensor being used for measuring the aerial image of a pattern on a mask that is provided on mask table MT. Such a measurement allows determining lens aberrations, lens magnification, and the focus plane of the lens, but also allows alignment of substrate table WT and mask pattern (mask table MT).

FIG. 2 shows a view of the image sensor in cross-section. In this example, the image sensor is based on diode technology. Silicon photodiodes are semiconductor devices that are responsive to photons. Photons are absorbed and create electron-hole pairs to generate a flow of electrical current in an external electrical circuit, proportional to the incident power. Photodiodes can be used to detect the presence or variations in minute quantities of light and can be calibrated for extremely accurate measurements of intensities having a dynamic range of eleven orders of magnitude.

The image sensor of FIG. 2 is made in a silicon (or another semiconducting material such as germanium (Ge), gallium arsenide (GaAs), or gallium nitride) wafer 101 that has been polished on both sides to obtain a required flatness (ultra-flat) and a thickness between 600 and 1000 μm. At one side of the wafer (denoted as the front side) a thin layer 102 of 1 to 10 μm silicon is epitaxially grown, in which layer the diodes 111 are processed at some locations in the wafer by means of known semiconductor manufacturing technology techniques including e.g. lithographic projection and ion implantation techniques. A diode is shown only schematically in FIG. 2. Electronic contacts 120 to the diodes are processed from the other side of the wafer (denoted as the back side). The contacts may be established by etching holes in the back side, which pass through the wafer to the ion implanted regions 112 of the diode at the front side. In this case, the etched holes may be filled with tungsten, which is electrically conducting. The tungsten pillars are electrically connected to larger bond flaps 121 at the back side of the wafer, which are to be connected to processing electronics. In another embodiment, the etched holes are left open at this stage. At some later stage they may be completely or partially (only on the walls, for instance) filled with a conductive glue when being mounted on an intermediate base plate, for instance.

The front surface of the wafer, in which the diodes were processed, is covered with a protective layer 103. For instance, it may be desirable for this layer to act as a plasma etch stop. In this example, layer 103 is a 10 to 20 nm thick layer of silicon nitride ($Si_3N_4$). Subsequently, a 50 to 100 nm thick metal layer 104 is sputtered on top of the silicon nitride layer. Marker patterns 113 are plasma-etched in the metal layer above the silicon diodes 111 (e.g. using known lithographic projection techniques) to define the marker patterns. The patterned metal layer above the photodiodes selectively passes EUV radiation to the photodiode according to the pattern in the metal layer.

In a further embodiment, an additional zirconium (Zr) layer in the order of 100 nm may be provided over the diodes, for instance, directly below layer 103 in the embodiment shown. One possible advantage of such a zirconium layer is effective blockage of deep ultraviolet and visible radiation, with passage in the order of 70% of the incident EUV radiation to the underlying diodes, such that the blocked radiation will not decrease the dynamic range and signal-to-noise ratio of the sensor or otherwise affect detection of an aerial image of EUV radiation.

Sensor plate 100 comprises a major part of a silicon wafer in which several photodiodes covered by marker patterns are provided. FIG. 3 shows that the image sensor plate 100 is carried by the upper surface of an intermediate base plate 200 to provide stability of the sensor plate and to also carry processing electronics 300 for the image sensor. Both upper and lower surfaces of the base plate are polished, the upper surface being polished to ultra-flat specifications. Image sensor and base plates are mounted together on substrate table WT. It may be desirable to fashion the base plate from a low thermal expansion material like a glass ceramic material (being a glass with some additional ceramic to yield favourable properties) such as Zerodure™ (a material available from Schott glass, Hattenbergstrasse 10, 55120, Mainz, Germany) and ULE™ (a material available from Corning Incorporated, 1 River Front Plaza, Corning, N.Y. 14831), or a glass such as quartz, presenting a coefficient of thermal expansion below $12 \times 10^{-6} K^{-1}$. A sensor plate of low thermal expansion material is also contemplated.

A glue or other adhesive may be used to mount the image sensor plate 100 on the base plate 200 as shown in the left-hand part of FIG. 3. For such purpose, grooves 210 may be provided in the top surface for containing a glue 130 that pulls the sensor plate against the base plate after shrinkage.

The sensor plate may also be attached to the base plate by direct bonding (being physical attraction between two very flat surfaces), which may provide a better overall flatness of the front side of the sensor plate 100. An embodiment adapted for direct bonding provides for a silicon dioxide layer (for instance, between 10 and 1000 nm thick) at the back side of the sensor plate for direct bonding to a quartz base plate, since the physical properties of the silicon dioxide layer resemble those of the quartz base plate. General requirements for direct bonding are a good cleanliness and good flatness of the contacting surfaces. In case of direct bonding, a very flat surface will be presented to the sensor plate for its support.

A cavity 220 is provided in the base plate for mounting an electronic circuitry plate 300 that comprises pre-amplifying electronics for the image sensor. In one implementation, the base plate is 6 mm thick and the cavity is 3 mm deep. Holes are drilled through the base plate to allow for electrical connections between sensor plate and electronic circuitry plate. The holes may be filled with some conductive glue (such as an epoxy) that contacts respective bond flaps of the sensor plate and the electronic circuitry plate after assembling the whole unit. One may also provide rods 230 (gold rods or gold-plated steel rods, for instance) through the holes that are connected to their respective bond flaps using a conductive glue. The electronic circuitry plate 300 may be mounted in various manners in its cavity in the base plate, for instance, using a silicone gel. Generally, the sensor plate will be mounted first on the base plate, followed by providing electrical connections through the holes in the base plate and mounting the electronic circuitry plate. From the electronic circuitry plate, further electric connections may be provided to further processing electronics elsewhere in the system.

It may be desirable to mount the base plate 200 in some removable manner on the substrate table WT, for instance, by a magnetic coupling by magnets 250, so that it can be removed for maintenance purposes. A substrate may be held on the substrate table by using a double-sided electrostatic chuck, which provides for attraction of a substrate to the chuck and of the chuck to the substrate table for holding of the substrate under vacuum conditions. The top side surface of sensor plate 100 is preferably in the same plane, or as close as possible, to the top side surface plane of the substrate. Chucks of various types and thickness may be employed for this purpose. Spacer plates 260 in between base plate and substrate table can be used to have the thickness of the sensor plate and base plate assembly adjusted accordingly. Such spacers are preferably provided around magnets 250 for holding the base plate on the substrate table and may also be attached to the base plate by direct bonding.

To shield the electronics inside cavity 220 and the electrical connections through base plate 200 from external electromagnetic influences (for instance, electromagnetic radiation present due to operation of an EUV plasma source), the base plate is preferably covered wholly or in part by a sufficiently thick metal layer 201. For most metals, a layer thickness in the order of 1 $\mu$m is sufficient for blocking radio frequency electromagnetic radiation in the 1 Hz to 1 GHz range. The metal layer may be provided, for example, by sputtering on the exterior surface of the base plate. Chromium is a preferred metal because of its high electrical conductivity, low oxidation and high sputtered layer quality.

In case the sensor plate is attached to the base plate by direct bonding, it should be prevented that the metal layer 201 is provided on that part of the base plate surface onto which the sensor plate is to be directly bonded at a later stage. To this end a dummy sensor plate may be positioned on the base plate while providing metal layer 201. A silicon wafer having a silicon nitride ($Si_3N_4$) skin layer may be used for this purpose, since it ensures easy removal of the dummy plate and a uniform direct bonding. The dummy plate can be removed by moderate mechanical force or using a nonpolar fluid. After attaching of sensor plate 100 to the non-covered area of base plate 200 an electrical connection between sensor plate and metal layer 201 is provided, for instance, by an electrical conductive glue around the perimeter of the sensor plate. Layer 201 is connected to, for instance, ground potential when the whole assembly is mounted on the substrate table WT. A clear area should also be provided for spacer plates in case such plates are to be attached to the base plate by direct bonding.

FIG. 4 shows in more detail a cross-section of one example of a photo diode as processed in a wafer for detecting EUV radiation. A p-type epitaxially grown silicon layer 102 is grown on a p-type substrate (silicon wafer) 101. N-type regions 105 are provided at sides of a defect-free n-type region 106 in the epitaxial layer 102, as well as p-type regions 107. A field oxide 108 covers the n-type and p-type regions and electrical connects 120 are provided in contact with the n-type and p-type regions. A platinum silicide or titanium silicide layer 109 a few nanometers thick is provided over the defect-free n-type region 106 on which radiation should be incident for detection purposes. The patterned area 113 in the metal layer 104 is provided above defect-free n-type region 106.

Figure 5A:
FIG. 5A depicts an embodiment of neighboring image sensor markers above respective sensors in the image sensing device.

For aerial image sensing purposes several photo diodes are provided on the sensor plate 100, each having its own pattern provided in the metal layer on top. FIG. 5A shows a series of four neighboring image sensor mark patterns, each provided above its respective photo diode. Each pattern fills a square of 200 $\mu$m×200 $\mu$m, for instance, and the patterns (and respective diodes) are approximately 200 $\mu$m apart, for instance. The series contains a −45° mark 413, an X direction mark 411, a Y direction mark 412 and +45° mark 414, respectively. The patterns are gratings having a certain pitch and line width and having their lines oriented as shown in the figure. The widths of the transmissive structures (referred to as groove widths or line widths in this specification) are in the order of 100 nm (for instance, between 30 and 300 mm), and the pitch maybe in the order of 1 $\mu$m (for instance, between 0.3 and 9 $\mu$m).

Figure 5B:
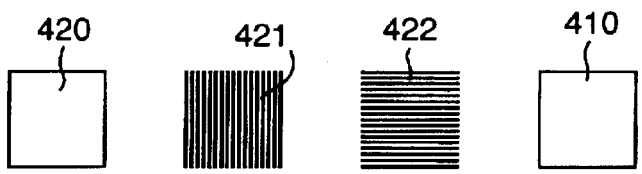
FIGS. 5B and 5C depict various marks for cooperation with the sensor marks of FIG. 5A.
Figure 5C:
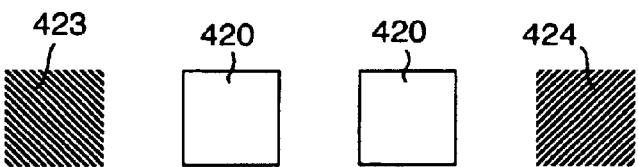

FIGS. 5B and 5C show two series of mask mark patterns for cooperation with the series of sensor mark patterns of FIG. 5A. The series of FIG. 5B contains a ratio mark 420, an X direction mark 421, a Y direction mark 422 and a ratio mark 420, respectively, while the series of FIG. 5C contains a −45° mark 423, two ratio marks 420 and a +45° mark 424, respectively. The marks are again gratings, as above, except for the ratio marks, which are areas of constant reflection provided on the mask. They may be fully reflective or 50% reflective, for instance. Each first mark of a series of mask marks is imaged onto the first mark of the series of sensor marks, each second mask mark onto the second sensor mark, etc. Outer dimensions of the mask marks are chosen such that an image of a mask mark will generally be larger or smaller than its corresponding image sensor mark to allow for a relative scanning movement of mask and image sensor marks. However, dimensions of pitch and line width of an image of a mask mark will generally correspond to its respective image sensor mark (taking lens magnification and/or demagnification into account).

Marks as shown have a constant pitch and line width across the mark. In general, however, pitch and line width may vary across a mark. In one example, triplets of lines (also referred to as grooves in the context of this specification) are presented, the lines in a triplet having different line widths, for instance. Further, one may have equal line width across a mark and a varying pitch, for instance, for each triplet of lines (grooves) for additional functionality, or both have varying line width and varying pitch across the mark.

Scanning in the X and Y direction and imaging the series of mask marks of FIG. 5B onto the series of sensor marks of FIG. 5A yields aerial image information for the X direction and Y direction marks, while for the +45° and −45° direction marks this operation yields uniform intensity distributions that support ratio sensing by the respective photo diodes. Signals detected by the ratio sensors are used for normalizing the signals yielded by the gratings and their respective photo diodes to correct for source fluctuations. The series of FIG. 5C yields aerial image information on the 45° directions.

Outer dimensions of the ratio mask marks 420 are shown to be identical to the outer dimensions of the grating mask marks (taking lens magnification and/or demagnification into account). However, in another case the dimensions of one of the ratio mask marks may be chosen such that it will underfill its respective image sensor mark, while the dimensions of the other ratio mask mark are chosen such it will overfill its respective image sensor mark for coarse capturing schemes while scanning. Scanning then yields the position of the small ratio mark spot within the capture range of its respective image sensor mark, while the corresponding signal can be corrected for source fluctuations using the signal of the overfilled image sensor mark.

FIG. 6 shows two alternative series of image sensor marks, the upper set comprising a ratio mark 410, an Y direction mark 412, and X direction mark 411 and another ratio mark 410, respectively, while the lower series comprises a ratio mark 410, a −45° mark 413, a +45° mark 414 and another ratio mark 410, respectively. The transmissive surface area of the square of ratio marks 410 equals the transmissive surface area of X and Y direction marks 411, 412 and of the −45° and +45° marks 413, 414. The series of mask marks to be used with these series of image sensor marks reflect the configuration of the series of image sensor marks. This embodiment presents two series of image sensor marks to yield X, Y, −45° and +45° information, while the previous embodiment only required one series. The considerations with regard to the dimensions of the marks are identical as set out above. FIG. 6 also shows the outer dimensions of the photodiodes underlying the mark patterns in phantom.

However, it may be advantageous to have ratio marks taking the form of gratings over the photo diodes, which have groove widths (also being referred to as line widths in this specification) equal to the line widths of the neighboring image sensor mark patterns, to have the same spectral sensitivity for both ratio sensor and image sensor. It may even be further preferred for those gratings in the same direction to also have an equal polarization dependency. Pitches may vary between image sensor and corresponding ratio sensor.

Returning again to FIG. 6, it also shows two alignment marks 450 to be used to align a substrate W present on the substrate table WT with respect to the substrate table. To this end alignment marks are provided on both the substrate WT and on the image sensor plate 100. An alignment module allows for aligning the alignment marks with regard to a reference using an alignment beam of radiation, while reading the corresponding positions of the substrate table using the interferometric measuring structure IF. When the substrate table has been aligned with respect to the mask using the image sensor, the position of the substrate with respect to the mask is now also known. In the embodiment shown, the alignment marks are phase marks that are provided in the front side of the sensor plate employing lithographic projection and manufacturing techniques, such as etching. Such techniques allow processing of alignment and image sensor marks with a high accuracy with respect to each other, which quality may be highly advantageous with respect to an operation of correctly positioning a substrate with respect to a pattern in a mask.

Figure 7:
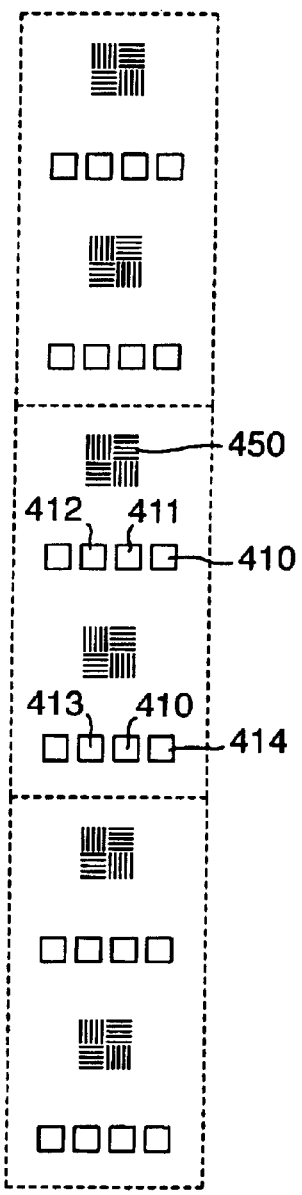
FIG. 7 depicts a region of the image sensor plate comprising several sets of image sensor marks and alignment marks.

Multiple sets of image sensor marks, ratio marks, underlying photo diodes and alignment marks may be provided on the sensor plate. Each set of marks may be designed for specific purposes and/or measurements. FIG. 7 depicts multiple sets corresponding to the ones of FIG. 6 present on the sensor plate.

Figure 8:
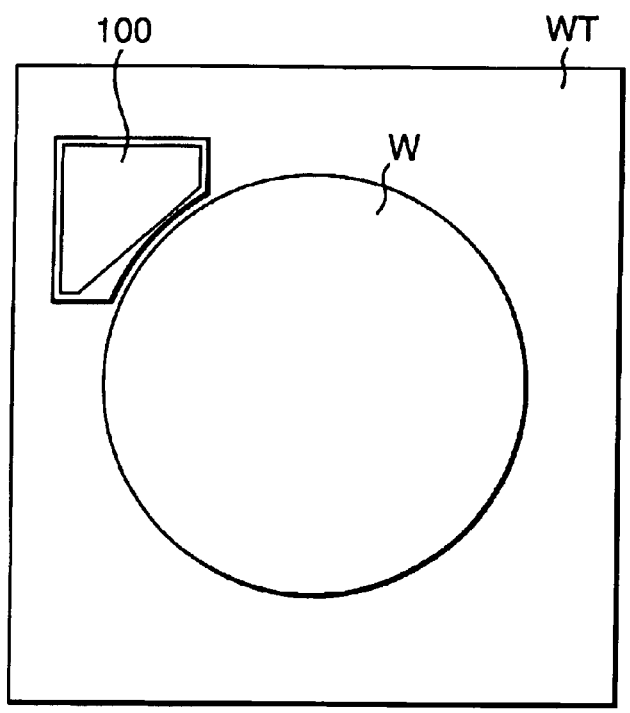
FIG. 8 depicts a top view of the substrate table holding a substrate and an image sensor plate.

FIG. 8 shows a top view of one example of substrate table WT on which a substrate W is located. In this example, sensor plate 100 is located in a corner of the substrate table next to the substrate position. Optionally, another sensor plate may be located in another corner of the substrate table, and/or other kinds of sensors may be located in one or more other corners.

Figure 9A:
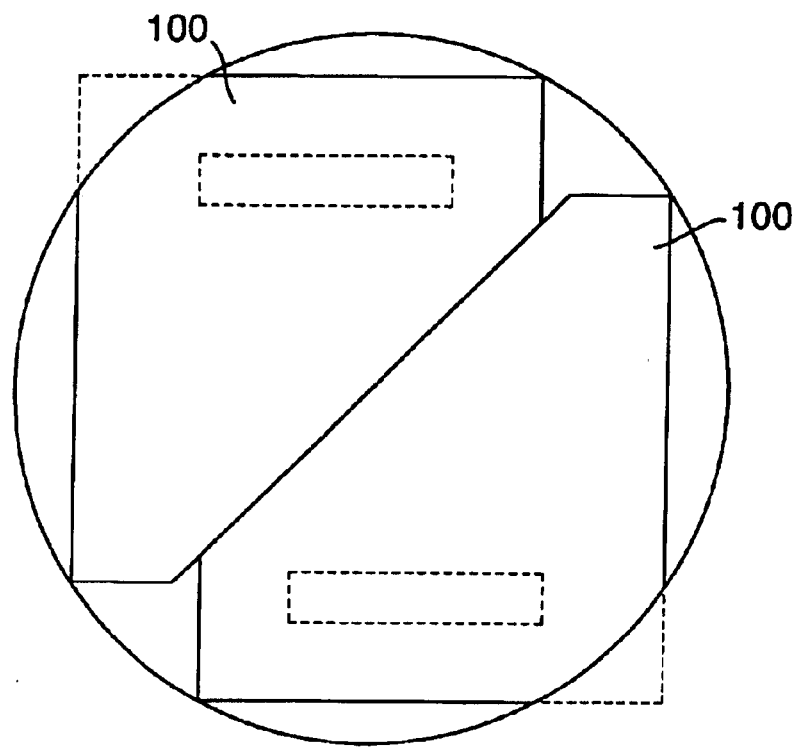
FIG. 9A depicts two image sensor plates according to the invention, which are processed from a six-inch wafer.
Figure 9B:
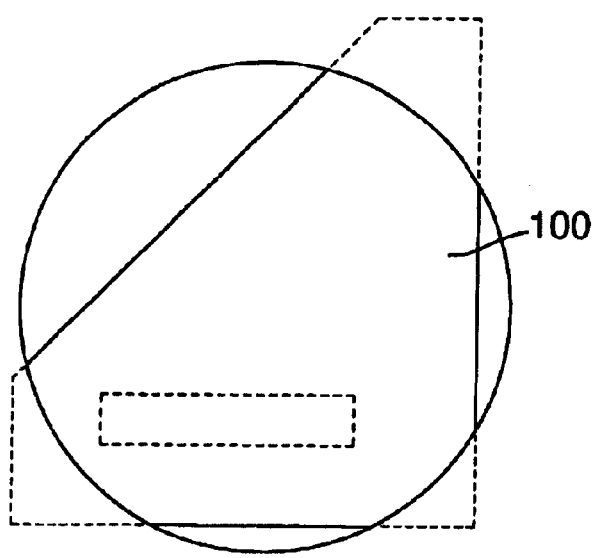
FIG. 9B depicts one image sensor plate according to the invention, which is processed from one four-inch wafer.

FIGS. 9A and 9B shows how sensor plates 100 may be cut from a six-inch wafer and a four-inch wafer, respectively. In the areas shown in phantom, the image sensors and marks as discussed above are processed using semiconductor manufacturing techniques. The reflective area may also be used by a level sensor (not shown) to determine height and tilt of the substrate table.

The image sensor and ratio sensor as described above may also be used for measuring the intensity of the projection beam, e.g. for control of the dose of radiation incident on the substrate in the imaging process. However, the sensors may become polluted over time, predominantly by an (amorphous) carbon layer due to hydrocarbon molecules cracked under EUV radiation. Carbon shows a high absorption of EUV radiation: for example, 1% of incident EUV radiation may be absorbed by a 0.5 nm thick carbon layer. The presence of a carbon layer of unknown thickness may interfere with the use of the image (and/or ratio) sensor for calibrated EUV dose measurements. In such case, visible light (or even infrared radiation) may be used to accurately measure the carbon layer thickness, e.g. to support correction for absorbed EUV radiation. One possible advantage of such an operation is to avoid cleaning of the sensors at short time intervals.

It is shown that radiation between 400 and 1100 nm may, to some extent, penetrate into grooves having a width in the order of 100 nm in case the radiation is polarized perpendicular to the grooves (TM polarization, as opposed to TE polarization). Such radiation will be the mark structures above the photo diodes, as described above, and will be detected by the photodiodes, which are sensitive to radiation above 400 nm.

It has further been shown that that radiation in the range of 400 to 1100 nm is readily absorbed by an (amorphous) carbon layer (absorption is even higher than for EUV radiation) and a carbon layer thickness can be accurately determined. Part of the beam of radiation in the range of 400–1100 nm can be split off using a beam splitter and be directed to a reference detector to correct for intensity fluctuations. EUV radiation would not be incident on such a reference sensor, and will therefore not cause carbon build-up on the reference sensor due to cracking of hydrocarbons by incident EUV radiation. The reference sensor will therefore remain clean. In case of a very stable light source, one might contemplate not employing a reference branch and not to employ TM polarized radiation.

Whilst specific embodiments of the invention have been described above, it will be appreciated that the invention as claimed below may be practiced otherwise than as described. It is explicitly noted that the description of these embodiments is not intended to limit the invention as claimed.

What is claimed is:

1. A lithographic projection apparatus configured and arranged to image a pattern onto a substrate that is at least partially covered by a layer of radiation-sensitive material, said apparatus comprising:

a radiation system configured and arranged to provide a projection beam of radiation;

a support structure configured and arranged to support a patterning structure, the patterning structure serving to produce a desired pattern in the projection beam;

a substrate table configured and arranged to hold the substrate;

a projection system configured and arranged to project the patterned projection beam onto a target portion of the substrate;

an image sensing device configured end arranged to measure a pattern in the patterned projection beam, said image sensing device including:

a slab;

at least one radiation-sensitive sensor arranged on a first side of the slab, said at least one sensor being an integral part of said slab and being sensitive to the radiation of the projection beam; and a film of a material that is non-transparent to the radiation of the projection beam, said film being provided on the first side of the slab over said at least one sensor and having a patterned segment above each sensor configured and arranged to selectively pass radiation of the projection beam to said sensor; and an intermediate plate made from a material having a thermal expansion coefficient below approximately $12 \times 10^{-6} K^{-1}$, wherein said slab is mounted with a surface opposite to the first side facing a slab-bearing surface of the intermediate plate.

2. The lithographic projection apparatus according to claim 1, wherein said intermediate plate is made from at least one among a glass and a glass ceramic material.

3. The lithographic projection apparatus according to claim 2, wherein said intermediate plate is made from at least one among ULE™, Zerodur™ and quartz.

4. The lithographic projection apparatus according to claim 1, wherein the sit-bearing surface of said intermediate plate is polished.

5. The lithographic projection apparatus according to claim 1, wherein at least on; of a surface adjacent to the first side of said slab and the surface opposite to the first side of said slab is polished.

6. The lithographic projection apparatus according to claim 1, wherein said slab is attached to said intermediate plate by direct bonding.

7. The lithographic projection apparatus according to claim 1, wherein electrical connections to said radiation-sensitive sensor are provided through said slab from the surface opposite to the first side of said slab.

8. The lithographic projection apparatus according to claim 7, wherein said electrical connections comprise metal-filled contact holes provided through said slab from the surface opposite to the first side of said slab.

9. The lithographic projection apparatus according to claim 7, wherein further electrical connections are provided from the surface opposite to the first side of said slab through said intermediate plate.

10. The lithographic projection apparatus according to claim 7, wherein the surface opposite to the first side of said slab is provided with electrical contact pads electrically connected to said electrical connections.

11. The lithographic projection apparatus according to claim 1, wherein the slab comprises a wafer of semiconductor material in which said radiation-sensitive sensor is fabricated.

12. The lithographic projection apparatus according to claim 11, wherein said semiconductor material comprises silicon.

13. The lithographic projection apparatus according to claim 1, wherein said radiation-sensitive sensor is a diode.

14. The lithographic projection apparatus according to claim 1, wherein said slab comprises a plurality of radiation-sensitive sensors.

15. The lithographic projection apparatus according to claim 1, wherein said hit side of the slab further comprises at least one alignment mark configured and arranged to support alignment of said substrate table with respect to a reference.

16. The lithographic projection apparatus according to claim 1, wherein the projection beam of radiation comprises extreme ultraviolet radiation having a wavelength of from 5 to 20 cm.

17. A device manufacturing method, said method comprising:

using a radiation system to provide a projection beam of radiation;

using patterning structure to endow the projection beam with a pattern in its cross-section;

projecting the patterned beam of radiation onto a target portion of a layer of radiation-sensitive material that at least partially covers a substrate; and measuring a pattern in the patterned projection beam using an image sensing device that includes a slab; at least one radiation-sensitive sensor arranged on a first side of the slab, said at least one sensor being an integral part of said slab and being sensitive to the radiation of the projection beam; and a film of a material that is non-transparent to the radiation of the projection beam, said film being provided on the first side of the slab over said at least one sensor and having a patterned segment above each sensor configured and arranged to selectively pass radiation of the projection beam to said sensor, wherein the slab is mounted with a surface opposite to the first side facing a slab-bearing surface of an intermediate plate made from a material having a thermal expansion coefficient below approximately $12 \times 10^{-6} K^{-1}$.

18. A device manufactured according to the method of claim 17.

19. The lithographic projection apparatus according to claim 1, wherein the image sensing device includes at least two radiation-sensitive sensors arranged on a first side of the slab, each sensor being an integral part of said slab and being sensitive to the radiation of the projection beam, and wherein the film includes a patterned segment above each sensor configured and arranged to selectively pass radiation of the projection beam to said sensor, and wherein at least one of said sensors is configured and arranged to measure art intensity of an unpatterned area in a cross-section of said patterned projection beam, and wherein at least another one of said sensors is configured and arranged to measure an intensity of a patterned area neighboring the unpatterned area in the cross-section of said patterned projection beam.

20. The lithographic projection apparatus according to claim 19, wherein at least one of the patterned segments comprises sets of grooves, each set having a separate pitch.

21. The lithographic projection apparatus according to claim 19, wherein each of said patterned segments above said sensors comprises a plurality of transmissive structures, a width of the transmissive structures within each patterned segment being at least substantially equal.

22. The lithographic projection apparatus according to claim 21, wherein the transmissive structures within each of said patterned segments are at least substantially equally oriented.

23. The lithographic projection apparatus according to claim 21, wherein the integrated surface areas of the transmissive structures for each patterned segment are substantially in the same order of magnitude.

24. The lithographic projection apparatus according to claim 21, wherein a width of each of said transmissive structures is in the range of 30 to 300 nm.

* * * * *

UNITED STATES PATENT AND TRADEMARK OFFICE
CERTIFICATE OF CORRECTION

PATENT NO. : 6,747,282 B2
DATED : June 8, 2004
INVENTOR(S) : Kroon et al.

It is certified that error appears in the above-identified patent and that said Letters Patent is hereby corrected as shown below:

Column 13,
Line 29, replace "end" with -- and --.
Line 57, replace "sit" with -- slab --.
Line 60, replace "on," with -- one --.

Column 14,
Line 29, replace "hit" with -- first --.

Signed and Sealed this

Fifteenth Day of February, 2005

JON W. DUDAS
*Director of the United States Patent and Trademark Office*